United States Patent
Sundararajan et al.

(10) Patent No.: US 12,191,885 B1
(45) Date of Patent: Jan. 7, 2025

(54) EARLY DETECTION OF SINGLE BIT ERROR ON ADDRESS AND DATA

(71) Applicant: Synopsys, Inc., Sunnyvale, CA (US)

(72) Inventors: Karthik Thucanakkenpalayam Sundararajan, Fremont, CA (US); Geogy Jacob, San Jose, CA (US)

(73) Assignee: Synopsys, Inc., Sunnyvale, CA (US)

( * ) Notice: Subject to any disclaimer, the term of this patent is extended or adjusted under 35 U.S.C. 154(b) by 0 days.

(21) Appl. No.: 17/953,689

(22) Filed: Sep. 27, 2022

(51) Int. Cl.
| | | |
|---|---|---|
| *H03M 13/15* | (2006.01) | |
| *H03M 13/00* | (2006.01) | |
| *G11C 29/42* | (2006.01) | |
| *G11C 29/52* | (2006.01) | |
| *H03M 13/11* | (2006.01) | |
| *H03M 13/45* | (2006.01) | |

(52) U.S. Cl.
CPC ....... *H03M 13/159* (2013.01); *H03M 13/611* (2013.01); *G11C 29/42* (2013.01); *G11C 29/52* (2013.01); *H03M 13/1111* (2013.01); *H03M 13/45* (2013.01)

(58) Field of Classification Search
CPC ............ H03M 13/1111; H03M 13/159; H03M 13/45; H03M 13/611; G11C 29/52; G11C 29/42
See application file for complete search history.

(56) References Cited

U.S. PATENT DOCUMENTS

| | | | | |
|---|---|---|---|---|
| 2002/0120901 | A1* | 8/2002 | Poirier | H03M 13/15 714/752 |
| 2003/0070133 | A1* | 4/2003 | Bauman | G06F 11/1044 714/763 |
| 2009/0201999 | A1* | 8/2009 | Kim | H04N 21/4405 382/233 |
| 2012/0317463 | A1* | 12/2012 | Sugahara | H03M 13/05 714/E11.032 |
| 2021/0248033 | A1* | 8/2021 | Boehm | G06F 11/3037 |

* cited by examiner

*Primary Examiner* — April Y Blair
*Assistant Examiner* — Sazzad Hossain
(74) *Attorney, Agent, or Firm* — Weaver Austin Villeneuve & Sampson LLP

(57) ABSTRACT

A method of detecting an error includes, in part, defining a bit pattern using a first multitude of bits, a second multitude of bits, the bits of an error correction code (ECC), and at least one user selected bit. The method further includes, in part, receiving a first value represented by the first multitude of bits and the at least one user selected bit; receiving a second value represented by the second multitude of bits; receiving a third value represented by the ECC bits. The method further includes, in part, generating a syndrome value from the first, second and third values; and using a subset of the syndrome value bits to detect the error in the first, second or third values. The third value is determined in accordance with the first and second values.

16 Claims, 8 Drawing Sheets

FIG. 1

| | $C_0 \rightarrow$ | | | | | | | | | | | | | | | | | | | $C_{19}$ |
|---|---|---|---|---|---|---|---|---|---|---|---|---|---|---|---|---|---|---|---|---|
| $R_0 \rightarrow$ | 0 | 1 | 2 | 3 | 4 | 5 | 6 | 7 | 8 | 9 | 10 | 11 | 12 | 13 | 14 | 15 | 16 | 17 | 18 | 19 |
| $R_1 \rightarrow$ | P | e0 | e1 | d0 | e2 | d1 | d2 | d3 | e3 | d4 | d5 | d6 | d7 | d8 | d9 | d10 | e4 | d11 | d12 | d13 |
| $R_2 \rightarrow$ | 20 | 21 | 22 | 23 | 24 | 25 | 26 | 27 | 28 | 29 | 30 | 31 | 32 | 33 | 34 | 35 | 36 | 37 | 38 | 39 |
| $R_3 \rightarrow$ | d14 | d15 | d16 | d17 | d18 | d19 | d20 | d21 | d22 | d23 | d24 | d25 | e5 | d26 | d27 | d28 | d29 | d30 | d31 | d32 |
| $R_4 \rightarrow$ | 40 | 41 | 42 | 43 | 44 | 45 | 46 | 47 | 48 | 49 | 50 | 51 | 52 | 53 | 54 | 55 | 56 | 57 | 58 | 59 |
| $R_5 \rightarrow$ | d33 | d34 | d35 | d36 | d37 | d38 | d39 | d40 | d41 | d42 | d43 | d44 | d45 | d46 | d47 | d48 | d49 | d50 | d51 | d52 |
| $R_6 \rightarrow$ | 60 | 61 | 62 | 63 | 64 | 65 | 66 | 67 | 68 | 69 | 70 | 71 | 72 | 73 | 74 | 75 | 76 | 77 | 78 | 79 |
| $R_7 \rightarrow$ | d53 | d54 | d55 | d56 | e6 | d57 | d58 | d59 | d60 | d61 | d62 | d63 | | | | | | | | |
| $R_8 \rightarrow$ | 80 | 81 | 82 | 83 | 84 | 85 | 86 | 87 | 88 | 89 | 90 | 91 | 92 | 93 | 94 | 95 | 96 | 97 | 98 | 99 |
| $R_9 \rightarrow$ | a0 | a1 | a2 | a3 | a4 | a5 | a6 | a7 | a8 | a9 | a10 | a11 | a12 | a13 | a14 | a15 | a16 | a17 | a18 | a19 |
| $R_{10} \rightarrow$ | 100 | 101 | 102 | 103 | 104 | 105 | 106 | 107 | 108 | 109 | 110 | 111 | 112 | 113 | 114 | 115 | 116 | 117 | 118 | 119 |
| $R_{11} \rightarrow$ | a20 | a21 | a22 | a23 | a24 | a25 | a26 | a27 | a28 | a29 | a30 | a31 | a32 | a33 | a34 | a35 | a36 | a37 | a38 | a39 |
| $R_{12} \rightarrow$ | 120 | 121 | 122 | 123 | 124 | 125 | 126 | 127 | | | | | | | | | | | | |
| $R_{13} \rightarrow$ | a40 | a41 | a42 | a43 | a44 | a45 | a46 | a47 | | | | | | | | | | | | |

| | C0 | C1 | C2 | C3 | C4 | C5 | C6 | C7 | C8 | C9 | C10 | C11 | C12 | C13 | C14 | C15 | C16 | C17 | C18 | C19 |
|---|---|---|---|---|---|---|---|---|---|---|---|---|---|---|---|---|---|---|---|---|
| R0 | 0 | 1 | 2 | 3 | 4 | 5 | 6 | 7 | 8 | 9 | 10 | 11 | 12 | 13 | 14 | 15 | 16 | 17 | 18 | 19 |
| R1 | P | e0 | e1 | d0 | e2 | d1 | d2 | d3 | e3 | d4 | d5 | d6 | d7 | d8 | d9 | d10 | e4 | d11 | d12 | d13 |
| R2 | 20 | 21 | 22 | 23 | 24 | 25 | 26 | 27 | 28 | 29 | 30 | 31 | 32 | 33 | 34 | 35 | 36 | 37 | 38 | 39 |
| R3 | d14 | d15 | d16 | d17 | d18 | d19 | d20 | d21 | d22 | d23 | d24 | d25 | e5 | d26 | d27 | d28 | d29 | d30 | d31 | d32 |
| R4 | 40 | 41 | 42 | 43 | 44 | 45 | 46 | 47 | 48 | 49 | 50 | 51 | 52 | 53 | 54 | 55 | 56 | 57 | 58 | 59 |
| R5 | d33 | d34 | d35 | d36 | d37 | d38 | d39 | d40 | d41 | d42 | d43 | d44 | d45 | d46 | d47 | d48 | d49 | d50 | d51 | d52 |
| R6 | 60 | 61 | 62 | 63 | 64 | 65 | 66 | 67 | 68 | 69 | 70 | 71 | 72 | 73 | 74 | 75 | 76 | 77 | 78 | 79 |
| R7 | d53 | d54 | d55 | d56 | e6 | d57 | d58 | d59 | d60 | d61 | d62 | d63 | | | | | | | | |
| R8 | 80 | 81 | 82 | 83 | 84 | 85 | 86 | 87 | 88 | 89 | 90 | 91 | 92 | 93 | 94 | 95 | 96 | 97 | 98 | 99 |
| R9 | | | | | | | | | | | | | | | | | a0 | a1 | a2 | a3 |
| R10 | 100 | 101 | 102 | 103 | 104 | 105 | 106 | 107 | 108 | 109 | 110 | 111 | 112 | 113 | 114 | 115 | 116 | 117 | 118 | 119 |
| R11 | a4 | a5 | a6 | a7 | a8 | a9 | a10 | a11 | a12 | a13 | a14 | a15 | a16 | a17 | a18 | a19 | a20 | a21 | a22 | a23 |
| R12 | 120 | 121 | 122 | 123 | 124 | 125 | 126 | 127 | | | | | | | | | | | | |
| R13 | a24 | a25 | a26 | a27 | a28 | a29 | a30 | a31 | | | | | | | | | | | | |

EARLY DETECTION OF SINGLE BIT ERROR ON ADDRESS AND DATA

TECHNICAL FIELD

The present disclosure generally relates to integrated circuits (IC), and more particularly, to detecting an error bit in data or address of an IC memory.

BACKGROUND

Data stored in or retrieved from a memory is prone to error. In addition, the memory address in which data is stored may also contain an error. To mitigate this problem, an error correction code (ECC) may be used to determine whether the data or address contains an error. Depending on the error identification algorithm and the number of bits in the ECC, a certain number of bits in the data or address detected as containing an error may be corrected. For example, according to a Hamming code scheme, an ECC having eight bits may be used to detect an error in the combined data and address represented by 120 bits.

SUMMARY

A method of detecting an error, in accordance with one embodiment of the present disclosure, includes, in part, defining a bit pattern using a first multitude of bits, a second multitude of bits, the bits of an error correction code (ECC), and at least one user selected bit. The method further includes, in part, receiving a first value represented by the first multitude of bits and the at least one user selected bit; receiving a second value represented by the second multitude of bits; receiving a third value represented by the ECC bits; generating a syndrome value from the first, second and third values; and using a subset of the syndrome value bits to detect the error in the first, second or third values. The third value is determined in accordance with the first and second values.

In one embodiment, the first multitude of bits represents data received from a memory, and the second multitude of bits represents the memory address in which the data is stored. In one embodiment, the first multitude of bits represents a memory address, and the second multitude of bits represents data stored in the memory address. In one embodiment, the first multitude of bits form a first group of contiguous bits in the bit pattern, and the second multitude of bits form a second group of contiguous bits in the bit pattern.

In one embodiment, the at least one user selected bit is disposed between the first and second groups of contiguous bits. In one embodiment, the method further includes, in part, detecting the error in the first multitude of bits if the number of bits in the first multitude of bits is smaller than the number of bits in the second multitude of bits. In one embodiment, the subset of bits is determined in accordance with the at least one user selected bit. In one embodiment, the subset of bits is determined in accordance with the syndrome value associated with the bit immediately following the user selected bit.

A circuit, in accordance with one embodiment of the present disclosure includes, in part, an error correction code (ECC) calculation circuit that calculates an ECC in response to receiving a multitude of bits pointing to a memory address, a multitude of bits representative of data stored in each memory address, and a multitude of pad bits; a syndrome calculation circuit that generates a multitude of syndrome values each associated with a different one of the ECC bits, the address bits and the data bits; and a comparator that detects an error in the address bits or the data bits using a subset of the bits representing the maximum syndrome value.

In one embodiment, the circuit further includes, in part, a memory configured to store the data and the ECC bits. In one embodiment, the comparator includes an AND gate. In one embodiment, the multitude of address bits form a contiguous group of bits identified by successive syndrome values. In one embodiment, the comparator is further configured to detect the error in the address if the number of bits in the data is greater than the number of bits in the address. In one embodiment, the subset has two bits. In one embodiment, the comparator is further configured to detect the error in the data if the number of bits in the address is greater than the number of bits in the data.

A non-transitory computer readable storage medium includes stored instructions, which when executed by a processor, cause the processor to determine a number of address bits in an address of the memory, and a number of data bits stored in a corresponding address of the memory; determine a sum defined by the number of address bits, the number of data bits, and the number of error correction code (ECC) bits in the ECC associated with one or more of the memory address and the memory data; determine a maximum syndrome value from the ECC; and responsive to a determination that the maximum syndrome value is greater than the sum: insert a logic value into each bit position corresponding to a syndrome value without a corresponding address bit, data bit, or ECC bit; determine a multitude of syndrome values each associated with one or more of the address bits, the data bits, and the ECC bits; and use a subset of the bits representing the multitude of syndrome values to detect the error.

In one embodiment, the address bits form a contiguous group of bits identified by successive syndrome values. In one embodiment, the subset of bits is determined in accordance with the syndrome value associated with the bit immediately following the inserted logic values. In one embodiment, the subset of bits is determined in accordance with the maximum syndrome value. In one embodiment, the instructions further cause the processor to detect the error in the address if the number of bits in the data is greater than the number of bits in the address.

BRIEF DESCRIPTION OF THE DRAWINGS

The disclosure will be understood more fully from the detailed description given below and from the accompanying figures of embodiments of the disclosure. The figures are used to provide knowledge and understanding of embodiments of the disclosure and do not limit the scope of the disclosure to these specific embodiments. Furthermore, the figures are not necessarily drawn to scale.

FIG. 1 illustrates a bit pattern that includes data bits, error correction code bits, and their corresponding syndrome values.

FIG. 5 illustrates another bit pattern used to detect an error bit, in accordance with one embodiment of the present disclosure.

FIG. 6 illustrates another bit pattern used to detect an error bit, in accordance with one embodiment of the present disclosure.

DETAILED DESCRIPTION

Figures 2, 3:
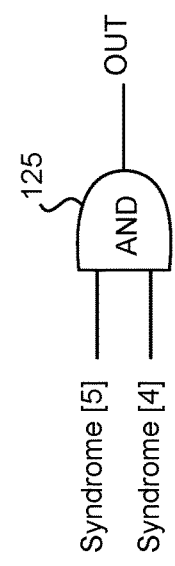
FIG. 2 illustrates a bit pattern used to detect an error bit, in accordance with one embodiment of the present disclosure.
FIG. 3 illustrates a schematic diagram of a circuit for detecting an error bit, in accordance with one embodiment of the present disclosure.

Data stored in a memory, as well as the memory address in which the data is stored, may be erroneous. A number of fault conditions, including electrical/magnetic interference or cosmic rays, may corrupt one or more bits of the data or address. A number of algorithms exist to detect and correct such errors. Error detection involves encoding the data with additional bits to generate encoded data. An ECC is an encoding scheme that enables the original uncorrupted data to be recovered even if some of the data bits are corrupted, i.e., have been flipped from 1 to 0, or from 0 to 1.

One type of ECC, commonly referred to as a single-error correction and double-error detection (SECDED) algorithm, is used to correct an error in a single bit and detect errors in a pair of bits. The SECDED algorithm generates a syndrome value that identifies the bit positions in which an error has occurred.

Figure 1:
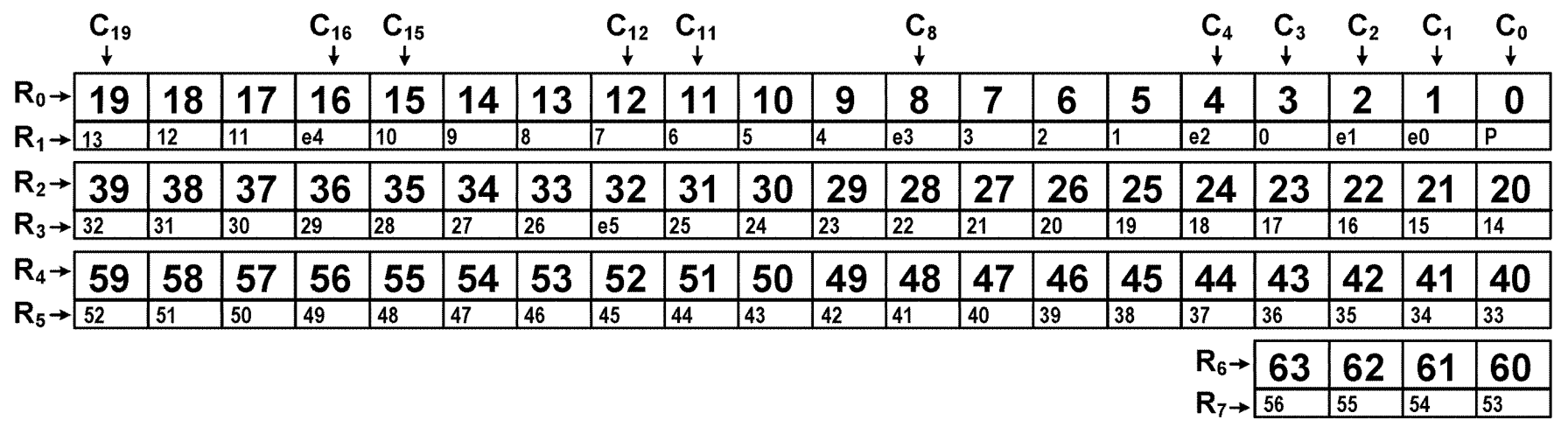

In a typical system, all the bits in the syndrome values are used to determine whether an error has occurred in the memory address or data, thereby increasing the hardware complexity, cost and the time required to detect such an error. In accordance with embodiments of the present disclosure, only a subset of the bits of the syndrome values are used to detect an error. Technical advantages of the present disclosure include, but are not limited to, less complex and less costly hardware resources, as well as reduced time in detecting such errors. FIG. 1 illustrates a bit pattern that includes data bits, error correction code bits, and their corresponding syndrome values. In FIG. 1 a bit pattern that includes 57 bits of data and/or address (the data and/or address are collectively referred to as data in reference to FIG. 1), as well as the data's associated 7 bit ECC and their corresponding syndrome values is illustrated. The data bit positions are shown in columns 0-19 (namely $C_0, C_1 \ldots C_{19}$) and rows 1, 3, 5, and 7 (namely $R_1, R_3, R_5$ and $R_7$). For example, data bit 0 is shown in column 3, row 1 ($C_3R_1$); data bit 7 is shown in column 12, row 1 ($C_{12}R_1$); and data bit 48 is shown in column 15, row 5 ($C_{15}R_5$). The parity bit associated with the ECC is shown in column 0, row 0, namely $C_0R_1$. Bits $e_0, e_1, e_2, e_3, e_4,$ and $e_5$ of the ECC are respectively shown in $C_1R_1, C_2R_1, C_4R_1, C_8R_1, C_{16}R_1,$ and $C_{12}R_3$. The position of the ECC bits may be based on a Hamming distance, in one embodiment.

The 7 bits of the ECC together with the 57 bits of the data are sent to a syndrome calculator, which is a circuit, to determine the syndrome values. The syndrome value is determined based on decoding a codeword from ECC encoding. The ECC encoding includes calculating original ECC bits from the corresponding data bits, then combining the data bits and the original ECC bits to form a codeword. The ECC is then decoded by taking the data bits from the codeword, recalculating the ECC bits, and calculating a bitwise XOR operation between the original ECC bits and the recalculated ECC bits. Such an output value from the bitwise XOR operation refers to the syndrome value. By checking the number of bits in the syndrome value, it is possible to determine whether the corresponding data bit or address bit has an error that can or cannot be corrected. The syndrome value associated with each data or ECC bit position, is shown above the corresponding bit position in rows $R_0, R_2, R_4$ and $R_6$. For example, the syndrome value associated with bit 4 of the data in $C_9R_1$ is shown above this bit in $C_9R_0$ as having a value of 9. Similarly, the syndrome value associated with bit 44 of the data in $C_{11}R_5$ is shown above this bit in $C_{11}R_4$ as having a value of 51. Accordingly, in the example described above with reference to FIG. 1, the syndrome is a 6-bit vector having a decimal value ranging from 0 to 63.

If an error exists in a single bit of the data, the parity bit in $C_0R_0$ is determined to be logic 1. If the parity bit is determined to be logic 1 and the syndrome value is non-zero, then the data bit corresponding to the syndrome value is detected as having an error. For example, if the parity bit is logic 1 and the syndrome value has a value of 48 (shown in $C_8R_4$), then data bit 41 (shown in $C_8R_5$) is detected as including an error that must be flipped to rectify the error. A single bit error (as determined by the parity bit) together with a syndrome value of 13 indicates that bit 8 of the data includes an error. Similarly, a single bit error together with a syndrome value of 4 indicates that bit 2 of the ECC code itself, namely $e_2$, has been corrupted and thus must be flipped. If the parity bit is not set but the syndrome has a non-zero value, then an inference is made that at least two of the bits have been corrupted. Generation of the syndrome values to detect the bit position in which an error has occurred is time consuming and uses hardware resources.

In accordance with embodiments of the present disclosure, if the sum of the bits defined by the data, the memory address in which the data is stored, and their corresponding ECC is fewer than the number of bits of a syndrome generator configured to detect the bit position in which an error in the data, address or the ECC may have occurred, then the unused bit positions in the data or address are inserted or padded with either logic zeros or ones (also referred to herein as user selected bits) so as to match the number of the bits of the syndrome generator. Thereafter, the ECC is computed for the data, padded bits, and the address bits. In one embodiment, the data and ECC bits form a first group of contiguous bits, and the memory address bits form a second group of contiguous bits. As described above, the bit positions between the first and second groups of contiguous bits is padded with either logic zeroes or ones (i.e., they are don't care positions) so that the sum of the bits in the first and second groups of contiguous bits together with the padded bits match the number of the syndrome generator. Accordingly, and as described in detail below, only a subset of syndrome bits is used to detect an error in the address or data bits, thereby increasing the speed of error detection while using fewer hardware resources.

FIG. 2 illustrates a bit pattern used to detect an error bit, in accordance with one embodiment of the present disclosure. In FIG. 2 a bit pattern 100 that includes, in part, 32 bits of data designated as $d_0, d_1 \ldots d_{30}, d_{31}$ in rows $R_1, R_3$ and $R_5$, and 16 bits of memory address in which the data are stored is illustrated. The address bits are designated as $a_0$, $a_1$ ... $a_{14}$, $a_{15}$ in rows $R_5$ and $R_7$. It is understood that the data and address bits may be represented in any desired pattern. For example, in another embodiment, the address bits may appear before the data bits. Bit pattern 100 is also shown as including, in part, a 7-bit ECC code. The parity bit of the ECC is designated as p in $C_0R_0$, and the remaining bits of the ECC are designated as $e_0$, $e_1$ ... $e_4$, $e_5$. Accordingly, the sum of the bits in the data, address and the ECC is 55.

The syndrome generator for the bit pattern shown in FIG. 2 has 6 bits and therefore can identify 64 bits positions—ranging from 0 to 63—in which an error in the data, address or ECC may occur. The syndrome value associated with each bit of data, address or the ECC is shown above the corresponding bit in rows $R_0$, $R_2$, $R_4$ and $R_6$. For example, the syndrome value associated with bit 4 (a4) of the address in $C_{12}R_5$ is shown above bit 4 of the address in $C_{12}R_4$ as having a value of 52. The syndrome value associated with bit 30 of the data in $C_{17}R_3$ is shown above bit 30 (d30) in $C_{17}R_2$ as having a value of 37. Similarly, the syndrome value associated with bit 4 of the ECC (e4) in $C_{16}R_1$ is shown above bit 4 of the ECC in $C_{16}R_0$ as having a value of 16.

Because the syndrome generator can identify more bit positions (i.e., 64 in this example) than the sum of the bits in the data, address and ECC (i.e., 55 in this example) bit pattern 100 includes 9 bit positions that are unused. The unused bit positions, identified in FIG. 2 between syndrome values 39-47, are treated as don't-care (unused) positions and are padded with either logic zeroes or ones to speed up error detection, in accordance with embodiments of the present disclosure and as described further below.

In the example shown in FIG. 2, the data and ECC bits form a first group of contiguous bits (corresponding to syndrome values 0-38), and the address bits form a second group of contiguous bits (corresponding to syndrome values 48-63). In accordance with embodiments of the present disclosure, the unused bit positions disposed between the first and second groups of contiguous bits, namely bit positions corresponding to syndrome values 39-47, are padded with either logic zeroes or ones. The ECC bits are then computed for the entirety of the 48 bits of data and address, as well as the 9 padded bits. Address bit a0 corresponding to syndrome value 48 immediately follows the padded bits corresponding to syndrome values 39-47.

Because the syndrome values that correspond to the address bits start from decimal value of 48, in accordance with one embodiment of the present invention, only syndrome bits [5:4], which is a subset of the 6-bit syndrome [5:0], and which corresponds to a decimal value of 48 pointing to the first bit of the address a0, are used to detect an error in the address bits. Therefore, a basic 2-input AND gate that receives syndrome bits [5:4] may be used in detecting an error in the address bits.

FIG. 3 illustrates a schematic diagram of a circuit for detecting an error bit, in accordance with one embodiment of the present disclosure. In FIG. 3 AND gate 125 is shown as receiving syndrome [5] (i.e., bit 5 of the syndrome) at its first input, and syndrome [4] at its second input. A logic 1 at the output of AND gate 125 is thus indicative of an error in one of the address bits for the bit pattern shown in FIG. 2. In another system, a comparator for comparing larger number of bits (6-bit) comparator may be used to detect an error in the address. Accordingly, embodiments of the present invention use fewer and less complex hardware resources in detecting an error bit, while performing the detection at higher speeds. The example shown in FIG. 2 is described with reference to detecting an error bit in the address. It is understood, however, that embodiments of the present disclosure equally apply to detecting an error in the data bits.

Figure 4:
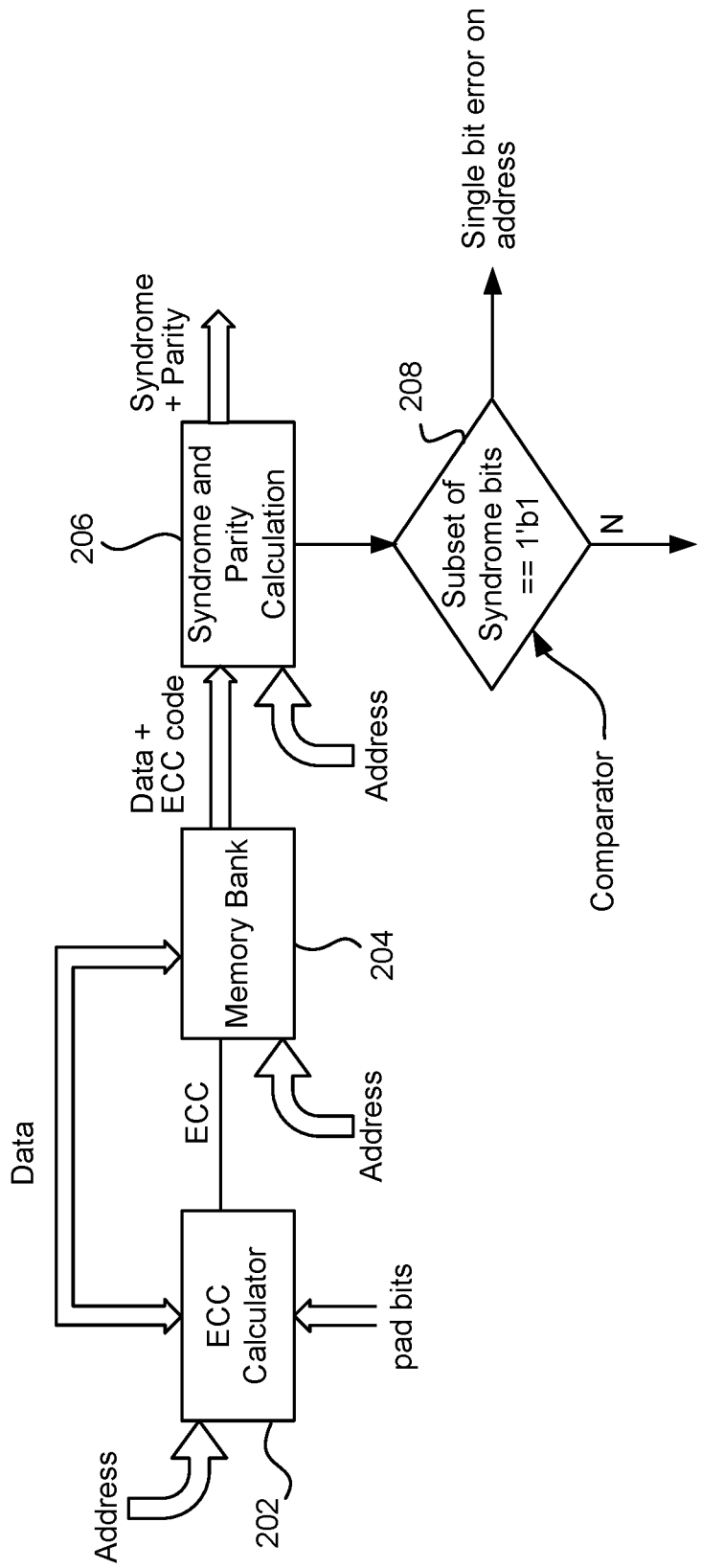
FIG. 4 illustrates a schematic diagram of a circuit used to detect an error in the address or data bits associated with a memory, in accordance with one embodiment of the present disclosure.

FIG. 4 illustrates a schematic diagram of a circuit used to detect an error in the address or data bits associated with a memory, in accordance with one embodiment of the present disclosure. ECC calculator block 202, which is a circuit, receives the data, the memory address in which the data is to be stored, as well as the pad bits as described above with reference to FIG. 2. The pad bits may be either a string of logic 1s or 0s, as described above, and fill any unused bit positions when the sum of the bits in the data, address and ECC is less than the maximum syndrome value, as determined by the number of bits of the ECC. For example, if the ECC has 7 bits, the syndrome has a value ranging from 1 to 64 (i.e., $2^{(7-1)}$) with the maximum syndrome value being 64. In response, ECC calculator block 202 generates the ECC bits, which together with the data, are stored in memory bank 204 during a memory write operation at the given address.

During a subsequent memory read operation, the data and ECC code are read from memory bank 204 and delivered to syndrome and parity calculation block 206. The address bits are also supplied to the syndrome and parity calculation block 206. Pad bits that may have been added to the data or address are also supplied to syndrome and parity calculation block 206. The positions of the pad bits as they are supplied to ECC calculator block 202, whether they are used to form a contiguous group of bits with the data bits (as shown in FIG. 2) or with the address bits, matches the positions of the pad bits as they are supplied to syndrome and parity calculation block 206.

In response, the syndrome and parity calculation block 206 supplies the syndrome values and the parity bit. Referring to FIGS. 3 and 2 concurrently, since the address bits in bit pattern 100 of FIG. 2 correspond to syndrome values 48 to 63, only bits 4 and 5 (i.e., syndrome [5:4]) of the 6-bit syndrome [5:0] are required to determine whether an error has occurred in the address bits. Accordingly, comparator 208 only needs to compare a subset of the bits of the syndrome value, namely bits 5 and 4 of the syndrome to bit 1 to determine whether an error in the address has occurred. In other words, because an error in the address bits will cause both bits 4 and the 5 of the 6-bit syndrome to be set to 1, comparator 208 only compares bits 4 and 5 of the syndrome to bit 1 to determine if an error in the address bit has occurred. If both the 5th bit and the 4th bit of the syndrome are set to 1, then an error in the address bit is detected. If either the 5th, or the 4th bit of the syndrome is not set to 1, then no error in the address bit is detected. Comparator 208 is shown in FIG. 2 as AND gate 125.

FIG. 5 illustrates another bit pattern used to detect an error bit, in accordance with one embodiment of the present disclosure. In FIG. 5, the bit pattern associated with a 64-bit data and a 48 bit address is shown. The bit pattern shown in FIG. 5 may be used in a 128 bits wide system and includes 8 ECC bits. The data bits are designated as $d_0$, $d_1$ ... $d_{62}$, $d_{63}$, and the address bits are designated as $a_0$, $a_1$ ... $a_{46}$, $a_{47}$. The parity bit of the ECC is designated as p, and the remaining bits of the ECC are designated as $e_0$, $e_1$ ... $e_6$, $e_7$. Bit positions for the data and ECC have syndrome values ranging from 0 to 71, as shown. Bit positions corresponding to syndrome values 72-79 are left blank in FIG. 5 indicating that they are don't-care positions that may be padded with logic zeroes or ones during the ECC calculation, in accordance with embodiments of the present disclosure. Bit positions for the address have syndrome values ranging from 80 to 127. Therefore, for the bit pattern shown in FIG. 5, if the comparison operation as performed by a comparator, such as comparator 208 of FIG. 4, indicates that bit position 6 of the 7-bit syndrome [6:0] is a logic 1, and either the bit position 5 or the bit position 4 of the syndrome is a logic 1, then a determination is made that an error in the address has occurred. It is understood that a logic 1 in ECC bit position 6 of the syndrome represents a value of 64 [1000000], a logic 1 in ECC bit position 5 of the syndrome represents a value of 32 [0100000], and a logic 1 in ECC bit position 4 of the syndrome represents a value of 16. Therefore, a logic 1 in both ECC bit positions 6 and 5 corresponds to a syndrome value of 96, and a logic 1 in both bit positions 6 and 4 corresponds to a syndrome value of 80. In other words, detecting a logic 1 in bit position 6 of the syndrome value 64, as well as detecting a logic 1 either in bit position 5 of the syndrome value 32, or in bit position 4 of the syndrome value 16, of the 7-bit syndrome value is indicative of an error in the address.

FIG. 6 illustrates another bit pattern used to detect an error bit, in accordance with one embodiment of the present disclosure. In FIG. 6, the bit pattern associated with a 64-bit data and a 32-bit address is shown. The bit pattern shown in FIG. 6 is adapted for use in a 128 bits wide system and includes 8 ECC bits. The data bits are designated as $d_0$, $d_1 \ldots d_{62}$, $d_{63}$, and the address bits are designated as $a_0$, $a_1 \ldots a_{30}$, $a_{31}$. The parity bit of the ECC is designated as p, and the remaining bits of the ECC are designated as $e_0$, $e_1 \ldots e_6$, $e_7$. Bit positions for the data and ECC have syndrome values ranging from 0 to 71, as shown. Bit positions corresponding to syndrome values 72-95 are left blank in FIG. 6 indicating that they are don't-care positions that may be padded with zeroes or ones during the ECC calculation. Bit positions for the address have syndrome values ranging from 96 to 127. Therefore, for the bit pattern shown in FIG. 6, only if the comparison operation as performed by a comparator, such as comparator 208 of FIG. 3, indicates that both bit positions 6 and 5 of the 7-bit syndrome [6:0] is a 1, then a determination is made that an error in the address has occurred.

Figure 7:
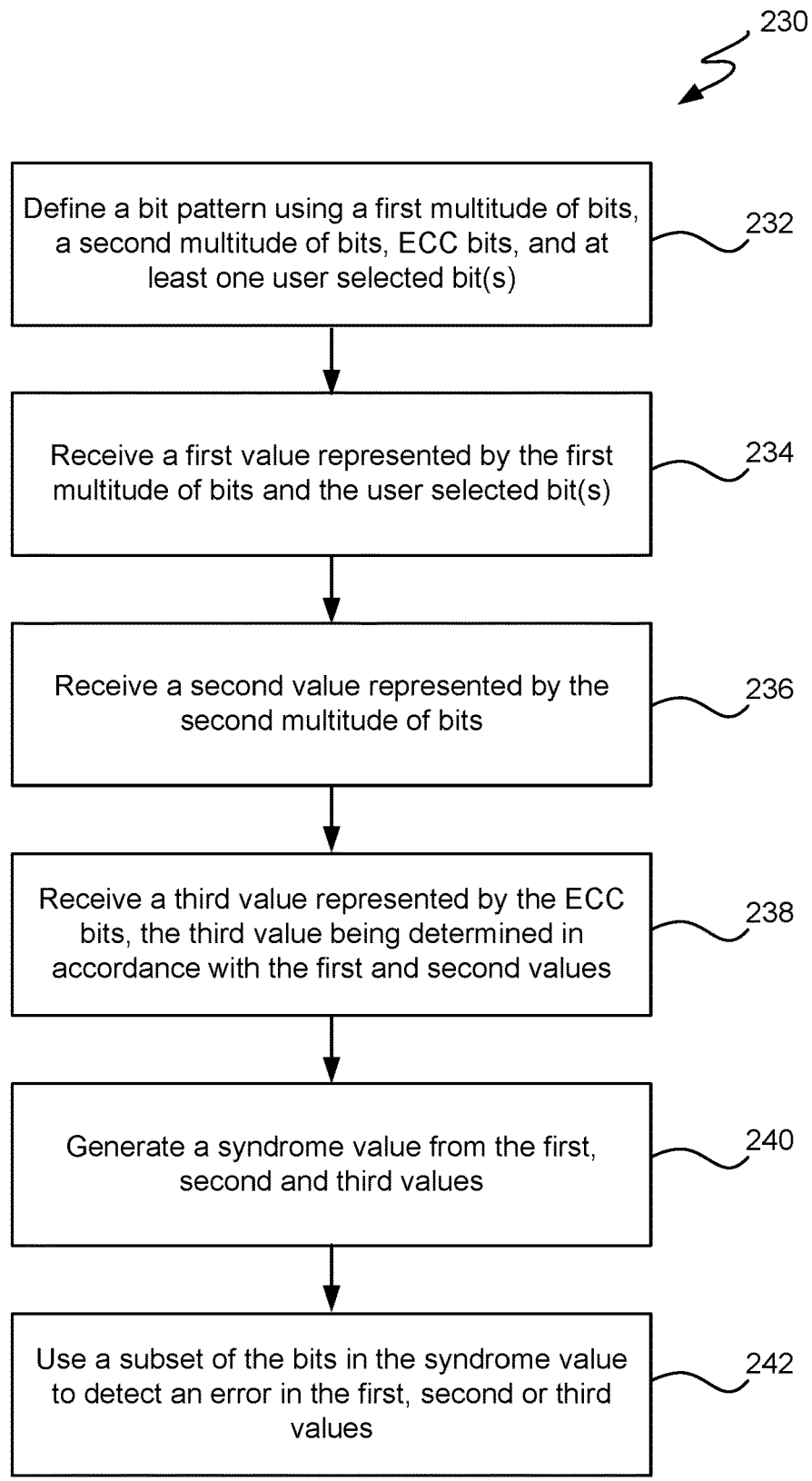
FIG. 7 is a flowchart for detecting an error bit, in accordance with one embodiment of the present disclosure.

FIG. 7 is a flowchart 230 for detecting an error bit, in accordance with one embodiment of the present disclosure. At 232, a bit pattern is defined using a first multitude of bits, a second multitude of bits, ECC bits, and at least one user selected bit(s). At 234, a first value represented by the first multitude of bits and the at least one user selected bit(s) is received. At 236, a second value represented by the second multitude of bits is received. At 238, a third value represented by the ECC bits is received. The third value is determined in accordance with the first and second values. At 240, a syndrome value is generated from the first, second and third values. At 242, a subset of the syndrome value bits is used to detect an error in the first, second or third values.

Figure 8:
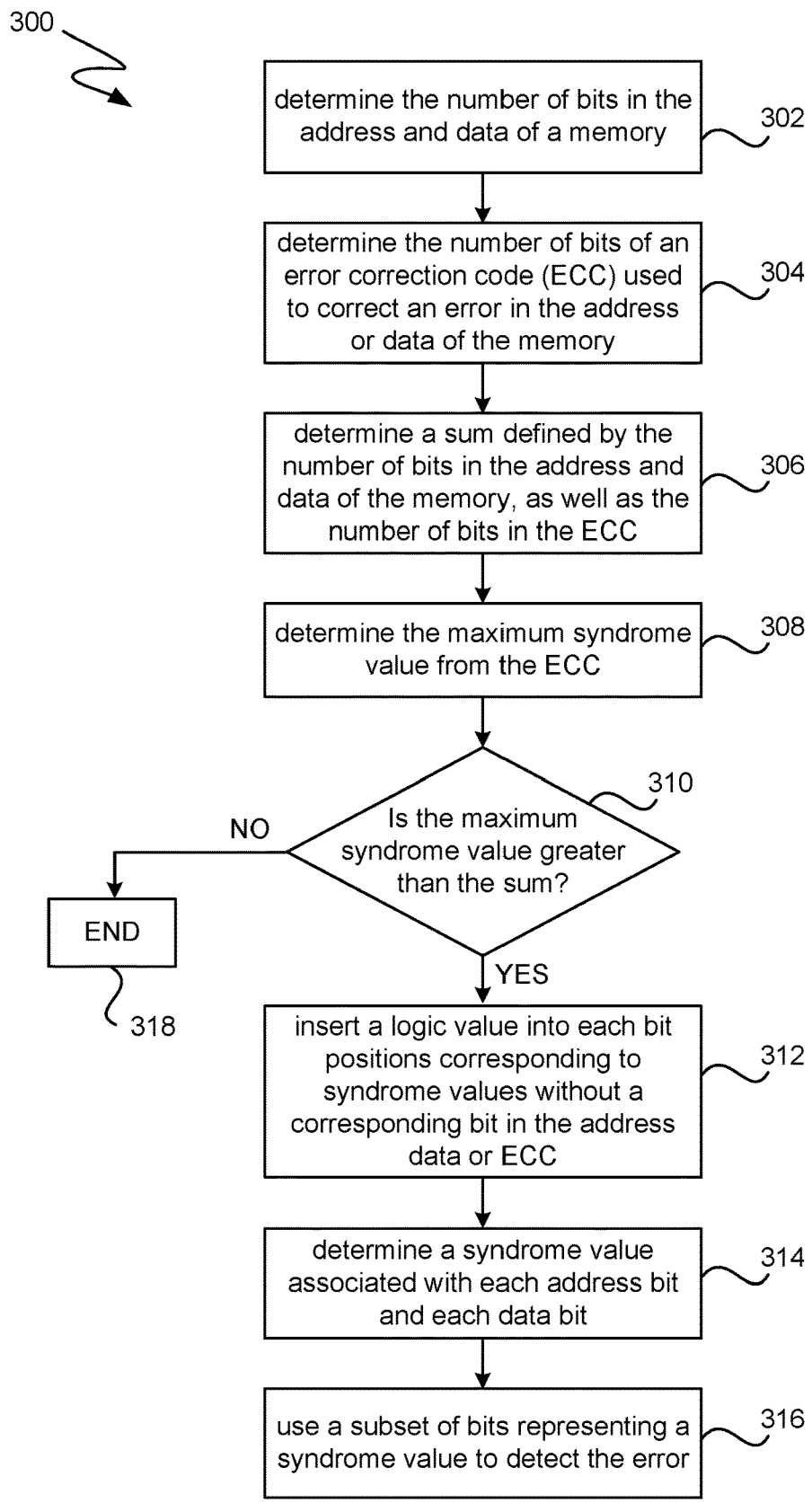
FIG. 8 is a flowchart for detecting an error in a memory address or memory data, in accordance with one embodiment of the present disclosure.

FIG. 8 is a flowchart 300 for detecting an error in a memory address or data, in accordance with one embodiment of the present disclosure. At 302, the number of bits used in the memory address and memory data is determined. At 304, the number of bits of an error correction code (ECC) used to correct an error in the memory address or memory data is determined. The number of bits in the ECC is determined based on the number of bits in the memory address and the memory data. At 306, a sum defined by the number of bits in the memory address, the number of bits in the memory data, and the number of bits in the ECC is determined. At 308, the maximum syndrome value is determined from the ECC. If at 310 it is determined that the maximum syndrome value is greater than the sum, then at 312, a logic value is inserted into each bit position corresponding to a syndrome value without a corresponding logic value. Next, at 314, a syndrome value is determined associated with each address bit and each data bit. Next, at 316, a subset of the bits representing each syndrome value is used to detect the error. If at 310, it is determined that the maximum syndrome value is not greater than the sum, the flow ends at 318.

Figure 9:
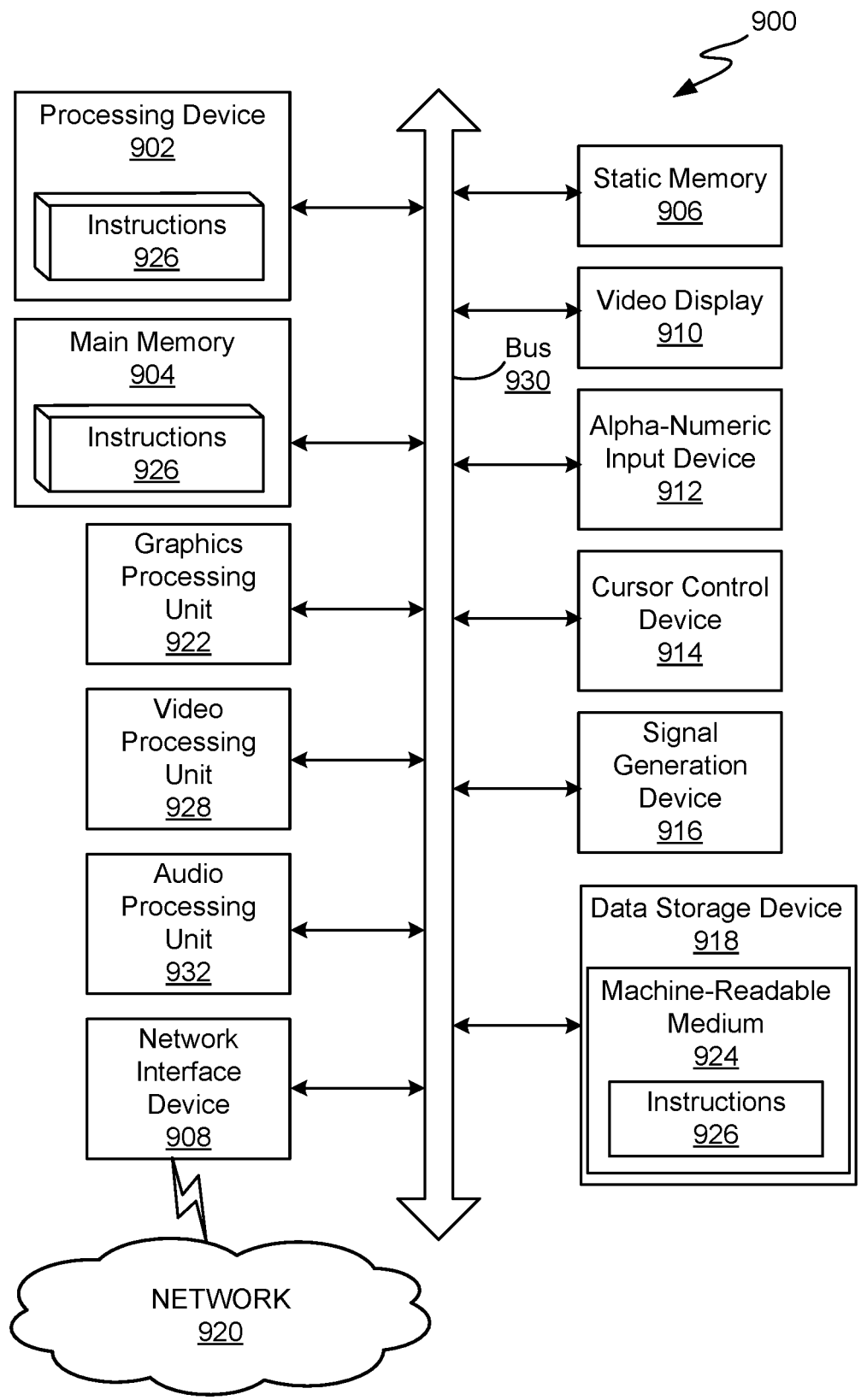
FIG. 9 is a diagram of an example of a computer system in which embodiments of the present disclosure may operate.

FIG. 9 illustrates an example machine of a computer system 900 within which a set of instructions, for causing the machine to perform any one or more of the methodologies discussed herein, may be executed. In alternative implementations, the machine may be connected (e.g., networked) to other machines in a LAN, an intranet, an extranet, and/or the Internet. The machine may operate in the capacity of a server or a client machine in client-server network environment, as a peer machine in a peer-to-peer (or distributed) network environment, or as a server or a client machine in a cloud computing infrastructure or environment.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 900 includes a processing device 902, a main memory 904 (e.g., read-only memory (ROM), flash memory, dynamic random access memory (DRAM) such as synchronous DRAM (SDRAM), a static memory 906 (e.g., flash memory, static random access memory (SRAM), etc.), and a data storage device 918, which communicate with each other via a bus 930.

Processing device 902 represents one or more processors such as a microprocessor, a central processing unit, or the like. More particularly, the processing device may be complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 902 may also be one or more special-purpose processing devices such as an application specific integrated circuit (ASIC), a field programmable gate array (FPGA), a digital signal processor (DSP), network processor, or the like. The processing device 902 may be configured to execute instructions 926 for performing the operations and steps described herein.

The computer system 900 may further include a network interface device 908 to communicate over the network 920. The computer system 900 also may include a video display unit 910 (e.g., a liquid crystal display (LCD) or a cathode ray tube (CRT)), an alphanumeric input device 912 (e.g., a keyboard), a cursor control device 914 (e.g., a mouse), a graphics processing unit 922, a signal generation device 916 (e.g., a speaker), graphics processing unit 922, video processing unit 928, and audio processing unit 932.

The data storage device 918 may include a machine-readable storage medium 924 (also known as a non-transitory computer-readable medium) on which is stored one or more sets of instructions 926 or software embodying any one or more of the methodologies or functions described herein. The instructions 926 may also reside, completely or at least partially, within the main memory 904 and/or within the processing device 902 during execution thereof by the computer system 900, the main memory 904 and the processing device 902 also constituting machine-readable storage media.

In some implementations, the instructions 926 include instructions to implement functionality corresponding to the present disclosure. While the machine-readable storage medium 924 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine and the processing device 902 to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm may be a sequence of operations leading to a desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing disclosure, implementations of the disclosure have been described with reference to specific example implementations thereof. It will be evident that various modifications may be made thereto without departing from the broader spirit and scope of implementations of the disclosure as set forth in the following claims. Where the disclosure refers to some elements in the singular tense, more than one element can be depicted in the figures and like elements are labelled with like numerals. The disclosure and drawings are, accordingly, to be regarded in an illustrative sense rather than a restrictive sense.

What is claimed is:

1. A method of detecting an error, the method comprising:
defining a bit pattern using a first plurality of bits, a second plurality of bits, error correction code (ECC) bits, and at least one user selected bit;
receiving a first value represented by the first plurality of bits;
receiving a second value represented by the second plurality of bits;
receiving a third value represented by the ECC bits, the third value being determined in accordance with the first value and the second value;
receiving a fourth value represented by the at least one user selected bit;
generating a plurality of syndrome values from the first value, the second value, the third value, and the fourth value;
wherein a syndrome value of the plurality of syndrome values is associated with a respective bit in the bit pattern, and
wherein the syndrome value corresponds to a plurality of syndrome value bits; and
using a subset of the syndrome value bits to detect the error in one or more of the first plurality of bits and the second plurality of bits.

2. The method of claim 1, wherein the first plurality of bits represents data received from a memory, and the second plurality of bits represents the memory address in which the data is stored.

3. The method of claim 1, wherein the first plurality of bits represents a memory address, and the second plurality of bits represents data stored in the memory address.

4. The method of claim 1, wherein the first plurality of bits form a first group of contiguous bits in the bit pattern, and the second plurality of bits form a second group of contiguous bits in the bit pattern.

5. The method of claim 4, wherein the at least one user selected bit is disposed between the first and second groups of contiguous bits.

6. The method of claim 1, wherein the subset of the syndrome value bits is determined in accordance with the at least one user selected bit.

7. The method of claim 1, wherein the subset of the syndrome value bits is determined in accordance with the syndrome value associated with the bit immediately following the user selected bit.

8. A circuit comprising:
an error correction code (ECC) calculation circuit that calculates an ECC having ECC bits computed using a plurality of bits pointing to a memory address, a plurality of bits representative of data stored in each memory address, and a plurality of received pad bits; wherein the plurality of memory address bits, the plurality of bits representative of the data, the plurality of received pad bits and the ECC bits define a bit pattern;
a syndrome calculation circuit that generates a plurality of syndrome values each associated with a different one of the ECC bits, the address bits and the data bits;
wherein a syndrome value of the plurality of syndrome values is associated with a respective bit in the bit pattern, and
wherein the syndrome value corresponds to a plurality of syndrome value bits; and
a comparator that detects an error in the address bits or the data bits using a subset of bits representing a maximum of the plurality of syndrome values.

9. The circuit of claim 8 further comprising:
a memory configured to store the data and the ECC bits.

10. The circuit of claim 8, wherein the comparator comprises an AND gate.

11. The circuit of claim 8, wherein the plurality of address bits form a contiguous group of bits.

12. The circuit of claim 8, wherein the subset has two bits.

13. A non-transitory computer readable storage medium comprising stored instructions, which when executed by a processor, cause the processor to:

determine a number of address bits in an address of the memory, and a number of data bits stored in a corresponding address of the memory;
determine a sum defined by the number of address bits, the number of data bits, and a number of error correction code (ECC) bits computed using the memory address bits and the memory data bits;
determine a maximum syndrome value from the sum;
responsive to a determination that the maximum syndrome value is greater than the sum:
insert a logic value into each bit position corresponding to a syndrome value without a corresponding address bit, data bit, or ECC bit, wherein the address bits, the data bits data, the ECC bits, and bits representative of the inserted logic values define a bit pattern;
determine a plurality of syndrome values using the address bits, the data bits, and the ECC bits;
wherein a syndrome value of the plurality of syndrome values is associated with a respective bit in the bit pattern, and
wherein the syndrome value corresponds to a plurality of syndrome value bits; and
use a subset of bits representing the plurality of syndrome values to detect an error.

14. The non-transitory computer readable storage medium of claim 13, wherein the address bits form a contiguous group of.

15. The non-transitory computer readable storage medium of claim 13,
wherein the subset of bits is determined in accordance with the syndrome value associated with the bit immediately following the inserted logic values.

16. The non-transitory computer readable storage medium of claim 13,
wherein the subset of bits is determined in accordance with the maximum syndrome value.

* * * * *